United States Patent [19]

Sone

[11] Patent Number: 4,742,319

[45] Date of Patent: May 3, 1988

[54] SURFACE-ACOUSTIC-WAVE RESONATOR

[75] Inventor: Takehiko Sone, Furukawa, Japan

[73] Assignee: Alps Electric Co., Ltd., Japan

[21] Appl. No.: 17,897

[22] Filed: Feb. 24, 1987

[30] Foreign Application Priority Data

Jun. 21, 1986 [JP] Japan .................. 61-145469

[51] Int. Cl.⁴ .................. H03H 9/64; H03H 9/25
[52] U.S. Cl. .................. 333/195; 310/313 A; 310/313 D; 333/194
[58] Field of Search .................. 333/150-155, 333/193-196; 310/313 R, 313 B, 313 C, 313 D; 331/107 A; 29/25.35

[56]  References Cited

U.S. PATENT DOCUMENTS

| 3,727,155 | 4/1973 | De Vries ........................ 333/194 |
| 4,162,465 | 7/1979 | Hunsinger et al. ............... 333/194 |
| 4,254,387 | 3/1981 | Redwood et al. ............. 333/196 X |
| 4,406,964 | 9/1983 | Chiba et al. ..................... 333/151 X |

FOREIGN PATENT DOCUMENTS

| 0017647 | 2/1979 | Japan ................................. 333/194 |
| 0010724 | 2/1981 | Japan ................................. 333/194 |

Primary Examiner—Marvin L. Nussbaum
Attorney, Agent, or Firm—Guy W. Shoup

[57]  ABSTRACT

A surface acoustic wave resonator so constructed that multiple reflection of a surface acoustic wave in interdigital electrodes is suppressed, no sub-resonance caused by the multiple reflection occurs in the inductive areas, and the resonator effects a reliable excitation.

2 Claims, 3 Drawing Sheets

ABSOLUTE VALUE OF REFLECTION COEFFICIENT = CIRCLE OF RADIUS 1

SURFACE-ACOUSTIC-WAVE RESONATOR

FIELD OF THE INVENTION

This invention relates to a surface-acoustic-wave resonator including interdigital electrodes and reflectors on a piezoelectric substrate for surface-acoustic-wave propagation therealong, and more particularly to an improvement preventing abnormal excitation when it is used in an oscillating circuit.

BACKGROUND OF THE INVENTION

Surface-acoustic-wave elements were originally limited to a specific military use. Recently, however, their use has been developed to FM tuners, television systems and other civilian devices, and a great importance is placed on them. Surface-acoustic-wave-elements are practically used as delay elements, oscillators, filters or other electronic elements. Advantageous features of various surface-acoustic-wave elements are miniatured sizes, decreased weights, high reliabilities and availability of mass-production due to their manufacturing process similar to that of integrated circuits. Under the circumstances, a great deal of surface-acoustic-wave elements are produced as indispensable electronic parts.

FIG. 4 shows one form of a surface-acoustic-wave resonator used in an oscillator or other devices.

The surface-acoustic-wave resonator includes a piezoelectric substrate 1 along which a surface acoustic wave travels, an interdigital electrode 2 provided on the piezoelectric substrate 1 to excite a surface acoustic wave, and comb-shaped reflectors 3 and 3' having a number of metal strips aligned at an interval and extending across the wave traveling direction.

When a voltage of a specific frequency is applied to the interdigital electrode, an electric field is produced on the surface of the piezoelectric substrate between electrode fingers of the interdigital electrode 2. Due to a piezoelectric property of the substrate 1, a distortion proportional to the voltage occurs and expands as a surface acoustic wave in both directions at a speed determined by the material of the piezoelectric substrate 1. The surface acoustic wave is reflected by the comb-shaped reflectors 3 and 3' to the interdigital electrode 2 and exhibits a resonance.

The resonator of FIG. 4 includes open-type reflectors in which metal strips are not connected to each other. However, some surface-acoustic-wave resonators as shown in FIG. 5 includes short-circuited reflectors 3 and 3' in which metal strips are connected to each other at respective ends thereof. Impedance properties of the surface-acoustic-wave resonators are shown by a reflection constant chart of FIG. 6.

In the same drawing, an upper semicircle A is a region in which the surface-acoustic-wave resonator exhibits inductive properties, and a lower semicircle B is a region in which the surface-acoustic-wave element exhibits capacitive properties. A curve shown by a solid line is a vector orbit obtained by applying a voltage of a desired frequency to the interdigital electrode 2. Capital letter C indicates a resonance point, D shows an anti-resonance point, M is a major resonance area, and S is a sub-resonance area. The outer circle is a circle of absolute value 1 of the reflection constant.

The drawing shows that when the frequency $\omega$ of a voltage applied to the interdigital electrode 2 is increased from a frequency lower than the resonance frequency to a frequency higher than the resonance frequency, the resonator exhibits inductance properties at two areas (shown by hatchings). More specifically, one of the areas is a major resonance area M produced by reflected waves from the reflectors 3 and 3' whereas the other area is a sub-resonance area S produced by internal reflected waves in the interdigital electrode 2.

In presence of two or more inductive frequency areas in a single resonator used in a Colpitts oscillator to excite a predetermined frequency, the resonator sometimes excites a frequency other than the predetermined value due to an external disturbance or other external factor because the inductive areas are used for excitation.

OBJECT OF THE INVENTION

It is therefore an object of the invention to provide a surface-acoustic-wave resonator capable of effecting a reliable excitation by decreasing the sub-resonance caused by multiple reflection in the interdigital electrode and by eliminating the sub-resonance in the inductive areas.

SUMMARY OF THE INVENTION

According to the invention, there is provided a surface-acoustic-wave resonator including at least one pair of interdigital electrodes for excitation of a surface acoustic wave, and a reflector means for reflecting back the surface acoustic wave excited by the interdigital electrodes, said resonator being characterized in that said interdigital electrodes are configured to suppress multiple reflections of the surface acoustic wave in itself.

The resonance caused by multiple reflections of a surface acoustic wave in the interdigital electrodes may be suppressed by configuring the interdigital electrodes in the form of metal strips in which each electrode finger of the electrodes is divided into two.

The resonance can be also suppressed by configuring the interdigital electrodes in a fashion that electrodes fingers thereof having two widths $\frac{1}{8}\lambda_0$ and $\frac{3}{8}\lambda_0$ ($\lambda_0$ is the wavelength of the center frequency) are aligned alternatingly.

With this arrangement where multiple reflection of a surface acoustic wave in the interdigital electrodes is suppressed, no sub-resonance caused by the multiple reflection occurs in the inductive areas, and the resonator effects a reliable excitation.

DETAILED DESCRIPTION

Figure 1:
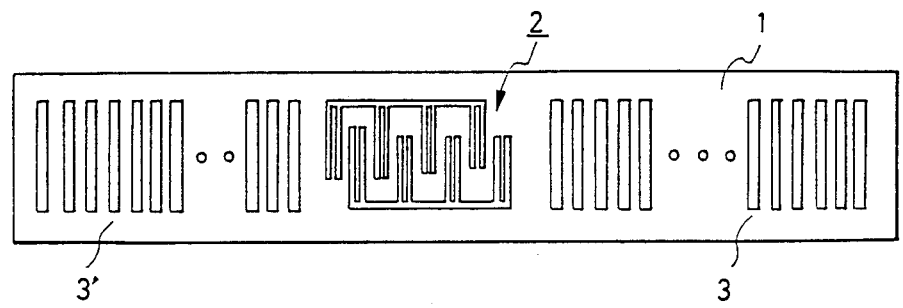
FIG. 1 is a plan view of a surface-acoustic-wave resonator embodying the invention.

The invention is hereinbelow described in detail, referring to a preferred embodiment illustrated in the drawings.

Figure 2:
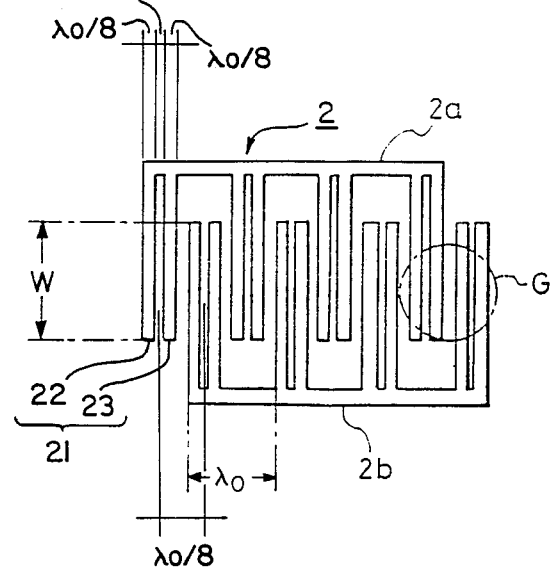
FIG. 2 is a fragmentary enlarged view of an interdigital electrode arrangement used in the surface-acoustic-wave resonator.

FIGS. 1 and 2 illustrate one form of a surface-acoustic-wave resonator having an open-type reflector and including a novel feature of the invention.

The surface-acoustic-wave resonator includes a piezoelectric substrate made from 41-turn, Y-axis-cut luthium niobate, and a interdigital electrode 2 and reflectors 3 and 3' both provided on the piezoelectric substrate 1 in the form of aluminum films of thickness 1000 Å by a known photolithographic technology.

The interdigital electrode 2 is formed by opposed comb-shaped electrodes 2a and 2b each having a plurality of electrode fingers 21. Each electrode finger 21 is bifurcated into metal strips 22 and 23. The electrodes fingers 21 are aligned at an interval $\lambda_0$ of 10 μm, and have an interdigitating or overlapping width of 20 $\lambda_0$. In the present text, one finger of the comb-shaped electrode 2a and one opposed finger of the comb-shaped electrode 2b (encircled at G in FIG. 2) are calculated as one electrode pair. In the subsequent description, the number of electrode fingers of the interdigital electrode 2 is variously changed.

In a first arrangement, the number of elements of the reflectors located at both sides of the interdigital electrode 2 is two hundreds.

The substrate is fixed to a hermatic seal (TO-5 type), wire-bonded by aluminum wire, and sealed in $N_2$ atmosphere. As the result, one-port resonator is obtained. The resonance frequency of the obtained surface-acoustic-wave resonator is 430 MHz approximately.

Figure 3:
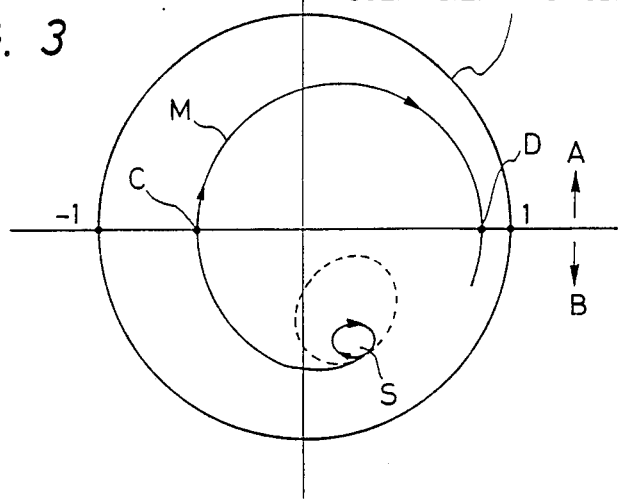
FIG. 3 is a chart of the reflection constant of the surface-acoustic-wave resonator.
Figure 4:
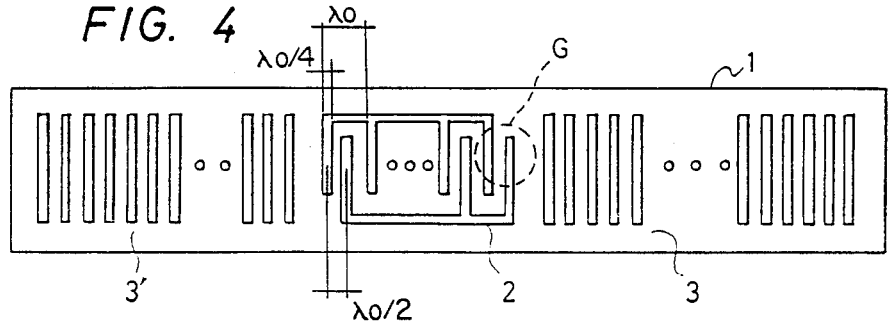
FIGS. 4 and 5 illustrate different forms of prior art surface-acoustic-wave resonators.
Figure 5:
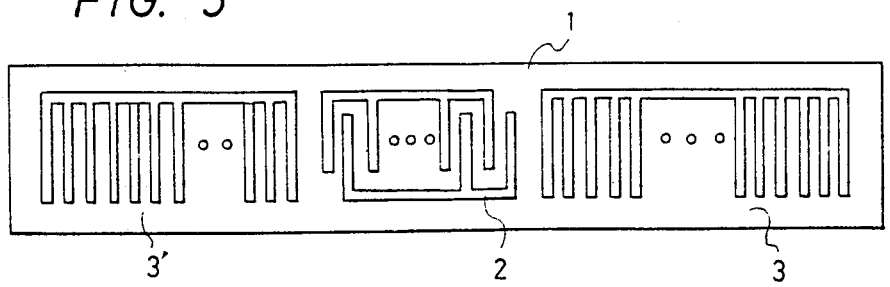
Figure 6:
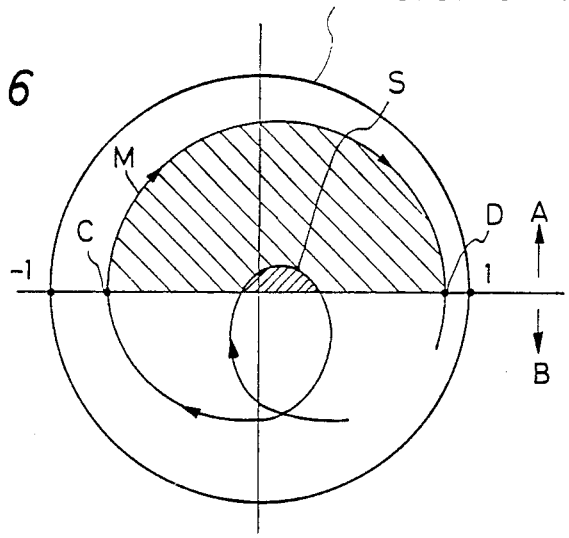
FIG. 6 is a chart of the reflection constant of the prior art surface-acoustic-wave resonators.

Analyzing the impedance property of the surface-acoustic-wave resonator, the sub-resonance area S is remarkably small as shown in the reflection constant chart of FIG. 3. When the electrode finger 21 of the interdigital electrode 21 is a single line, the sub-resonance area S increases as shown by a hatching in FIG. 3. further, if the number of pairs of electrode fingers of the interdigital electrode 2 is 14 or less as will be described later, the sub-resonance area S is positioned in the capacitance area B and outside the inductive area A. Therefore, the major resonance area M merely exists in the inductive area A.

In some experiments changing the number of pairs of surface-acoustic-wave resonator, characteristics shown in Table 1 were measured.

In further experiments configuring the electrode finger 21 of the interdigital electrode 2 in the form of a single line and changing the number of pairs of electrode fingers, characteristics shown in Table 2 were measured.

TABLE 1

| No. of IDT pairs | 8.5 | 10.5 | 12.5 | 13.5 | 14.5 | 15.5 | 17.5 | 20.5 |
|---|---|---|---|---|---|---|---|---|
| Result | O | O | O | O | X | X | X | X |

TABLE 2

| No. of IDT pairs | 5.5 | 6.5 | 7.5 | 8.5 | 9.5 | 10.5 | 12.5 | 15.5 |
|---|---|---|---|---|---|---|---|---|
| Result | O | O | O | X | X | X | X | | wherein O indicates that a region other than a required excitation frequency is capacitive, i.e. that there exists only one region rendered inductive by a change of the frequency, and wherein X indicates that an inductive area exists in the region of a required excitation frequency, i.e. that there exist two or more areas rendered inductive by a change in the frequency.

As described by using an interdigital electrode which suppresses multiple reflection in itself, the subresonance caused by the multiple reflection can be suppressed. Further, by employing 14 or less pairs of electrode fingers of the interdigital electrode 2, the major resonance area M merely exists in the inductive area A, and the sub-resonance area S caused by the interdigital electrode 2 is located in the capacitive area B. Therefore, a reliable excitation is obtained.

In similar experiments using piezoelectric substrates made from lithium niobate cut along 30-degree and 50-degree rotated Y-axes respectively, the same results were obtained.

In similar experiments changing the interdigitating width W of the interdigital electrode 2 from 5 to 200 $\lambda_0$, the same results were obtained.

Further, in similar experiments adding a cosine, Hamming or other weighting to the interdigital electrode 2, the same results were obtained.

Figure 7:
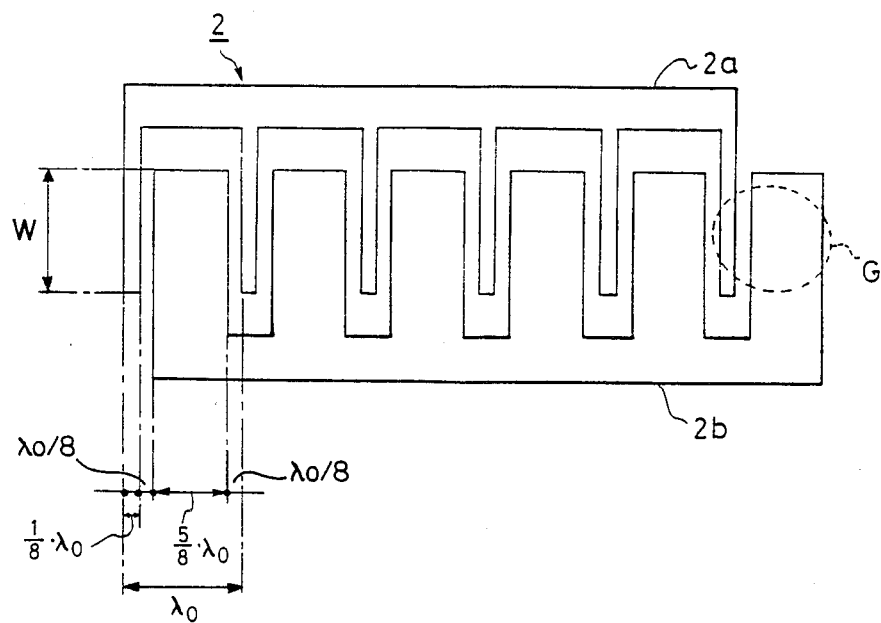
FIG. 7 is a fragmentary enlarged view of another form of the interdigital electrode arrangement used in the surface-acoustic-wave resonator according to the invention.

FIG. 7 illustrates another form of the interdigital electrode according to the invention.

The interdigital electrode 2 consists of opposed comb-shaped electrodes 2a and 2b. The comb-shaped electrode 2a has electrode fingers having a width $\frac{1}{8}\lambda_0$ (where $\lambda_0$ is the pitch of the electrode fingers), and the comb-shaped electrode 2b has electrode fingers having a width $\frac{3}{8}\lambda_0$ and interdigitatingly aligned with the electrode fingers of the comb-shaped electrode 2a one after another.

In this embodiment, one finger of the comb-shaped electrode 2a and one opposed finger of the comb-shaped electrode 2b are calculated as one electrode pair. In experiments changing the number of the electrode pairs of the interdigital electrode 2, their characteristics were measured. It resulted in the same data as in Table 1.

As described, according to the invention arrangement, the sub-resonance phenomenon caused by multiple reflections of a surface acoustic wave inside the interdigital electrode can be suppressed. Multiple reflections of a surface acoustic wave inside the interdigital electrode can be suppressed by bifurcating each electrode finger of the interdigital electrode into two metal strips, or by alternatingly placing electrode fingers which are $\frac{1}{8}\lambda_0$ and $\frac{3}{8}\lambda_0$ wide approximately (where $\lambda_0$ is the wavelength of the center frequency). This arrangement effectively suppresses the sub-resonance caused by multiple reflections of a surface acoustic wave inside the interdigital electrode so as to prevent the sub-resonance at least in the inductive area. Therefore, when the invention resonator is used in an oscillating circuit, a reliable excitation is established without specific modification to the circuit.

What is claimed is:

1. In a surface acoustic wave resonator comprising a 30–50 degree rotated, Y-axis cut lithium niobate piezoelectric monocrystalline substrate for propagating a surface acoustic wave, a pair of spaced apart reflectors forming a resonant cavity between them on a surface of the substrate for reflecting the surface acoustic wave across the cavity, and a pair of opposing electrodes having interdigitated fingers arranged in the resonant cavity between the reflectors for exciting a surface acoustic wave of a desired wavelength, the improvement wherein each of said opposing electrodes in formed with a plurality of fingers spaced apart at uniform intervals equal to said wavelength, each of said fingers is bifurcated into two metal strips spaced apart for suppressing subresonance of the surface acoustic wave within said electrodes so that they do not cause inductance, each bifurcated finger of one electrode being paired with a respective bifurcated finger of the other electrode and interdigitated with an equal spacing between fingers, and the number of finger pairs is less than 14.

2. In a surface acoustic wave resonator comprising a 30–50 degree rotated, Y-axis cut lithium niobate piezoelectric monocrystalline substrate for propagating a surface acoustic wave, a pair of spaced apart reflectors forming a resonant cavity between them on a surface of the substrate for reflecting the surface acoustic wave across the cavity, and a pair of opposing electrodes having interdigitated fingers arranged in the resonant cavity between the reflectors for exciting a surface acoustic wave of a desired wavelength, the improvement wherein each of said opposing electrodes is formed with a plurality of fingers spaced apart at uniform intervals equal to said wavelength, the fingers of one electrod each having a width of $\frac{1}{8}$ said wavelength and the fingers of other electrode each having a width of $\frac{3}{8}$ said wavelength for suppressing subresonance of the surface acoustic wave within said electrodes so that they do not cause inductance, each finger of one electrode being paired with a respective finger of the other electrode and interdigitated with an equal spacing between fingers, and the number of finger pairs is less than 14.

* * * * *